US007816930B2

(12) United States Patent
Young et al.

(10) Patent No.: US 7,816,930 B2
(45) Date of Patent: Oct. 19, 2010

(54) HIGH TEMPERATURE RANGE ELECTRICAL CIRCUIT TESTING

(75) Inventors: Ronald W. Young, Pocatello, ID (US); Frank G. J. DeRuyck, Nazareth (BE)

(73) Assignee: ON Semiconductor, Phoenix, AZ (US)

(*) Notice: Subject to any disclaimer, the term of this patent is extended or adjusted under 35 U.S.C. 154(b) by 182 days.

(21) Appl. No.: 11/871,716

(22) Filed: Oct. 12, 2007

(65) Prior Publication Data

US 2009/0115437 A1    May 7, 2009

(51) Int. Cl.
  *G01R 31/02* (2006.01)
(52) U.S. Cl. .................................. 324/754; 324/760
(58) Field of Classification Search ................ None
  See application file for complete search history.

(56) References Cited

U.S. PATENT DOCUMENTS

| | | | |
|---|---|---|---|
| 5,670,889 A | 9/1997 | Okubo et al. | |
| 6,064,215 A | 5/2000 | Kister | |
| 6,667,631 B2 | 12/2003 | Ivanov | |
| 6,831,455 B2 | 12/2004 | Yonezawa | |
| 6,894,480 B2 * | 5/2005 | Back | 324/158.1 |
| 7,375,542 B2 * | 5/2008 | Teneketges | 324/765 |
| 7,486,089 B2 * | 2/2009 | Abe | 324/754 |

* cited by examiner

*Primary Examiner*—Vinh P Nguyen
(74) *Attorney, Agent, or Firm*—Workman Nydegger

(57) ABSTRACT

An electrical circuit testing assembly that includes a mechanical reference that is relatively stationary as compared to a circuit under test. A probe support assembly is coupled to the mechanical reference and includes probes for contacting interconnect pads on the circuit under test. Optionally, the probe support structure is attached to the mechanical reference via a column that is thermally resistive. Also optionally, a testing circuitry support structure (e.g., a printed circuit board) is not rigidly attached to the mechanical reference or to the probe support structure, thereby permitting the testing circuitry support structure to float with respect to the probe support structure.

17 Claims, 11 Drawing Sheets

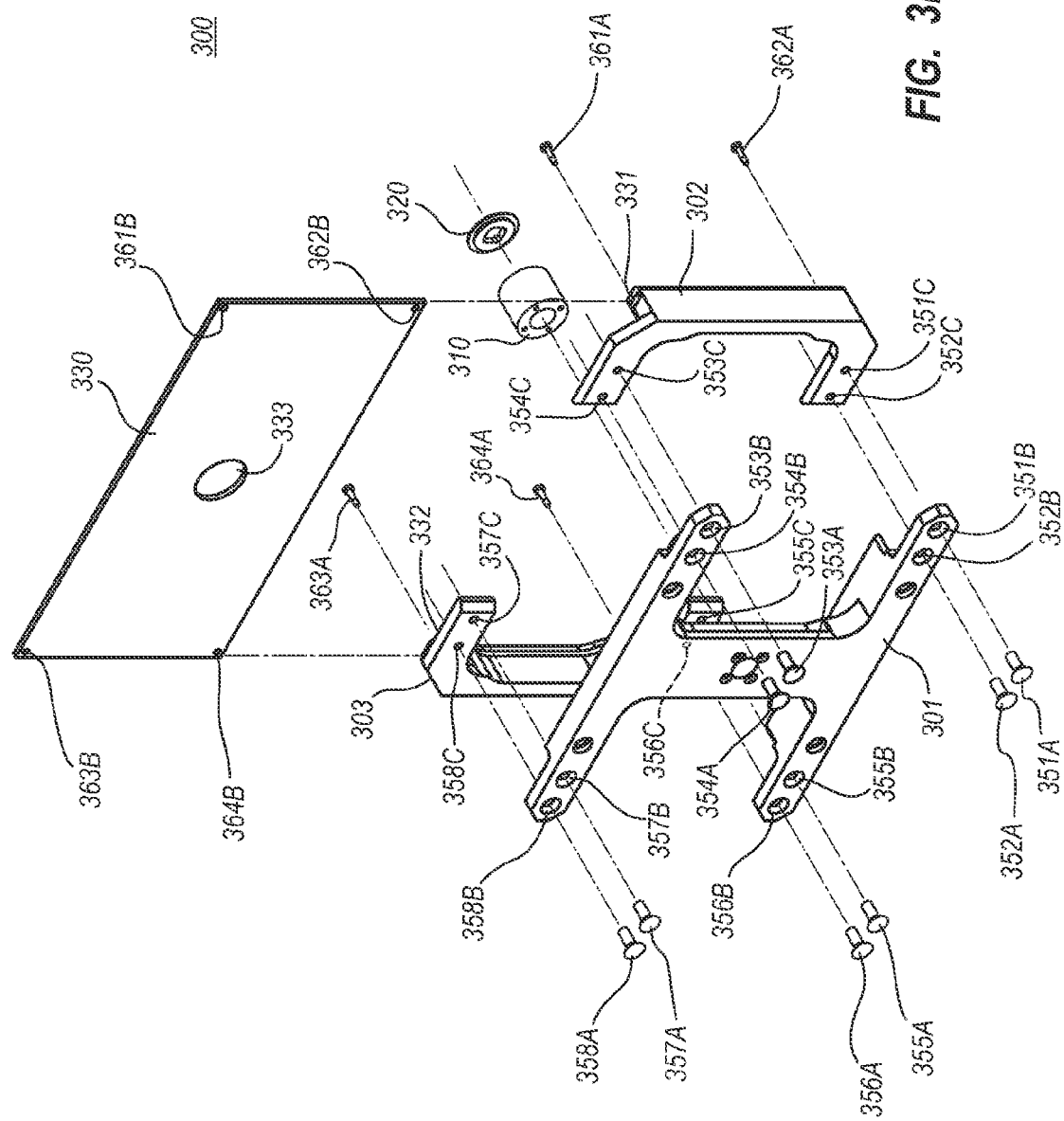

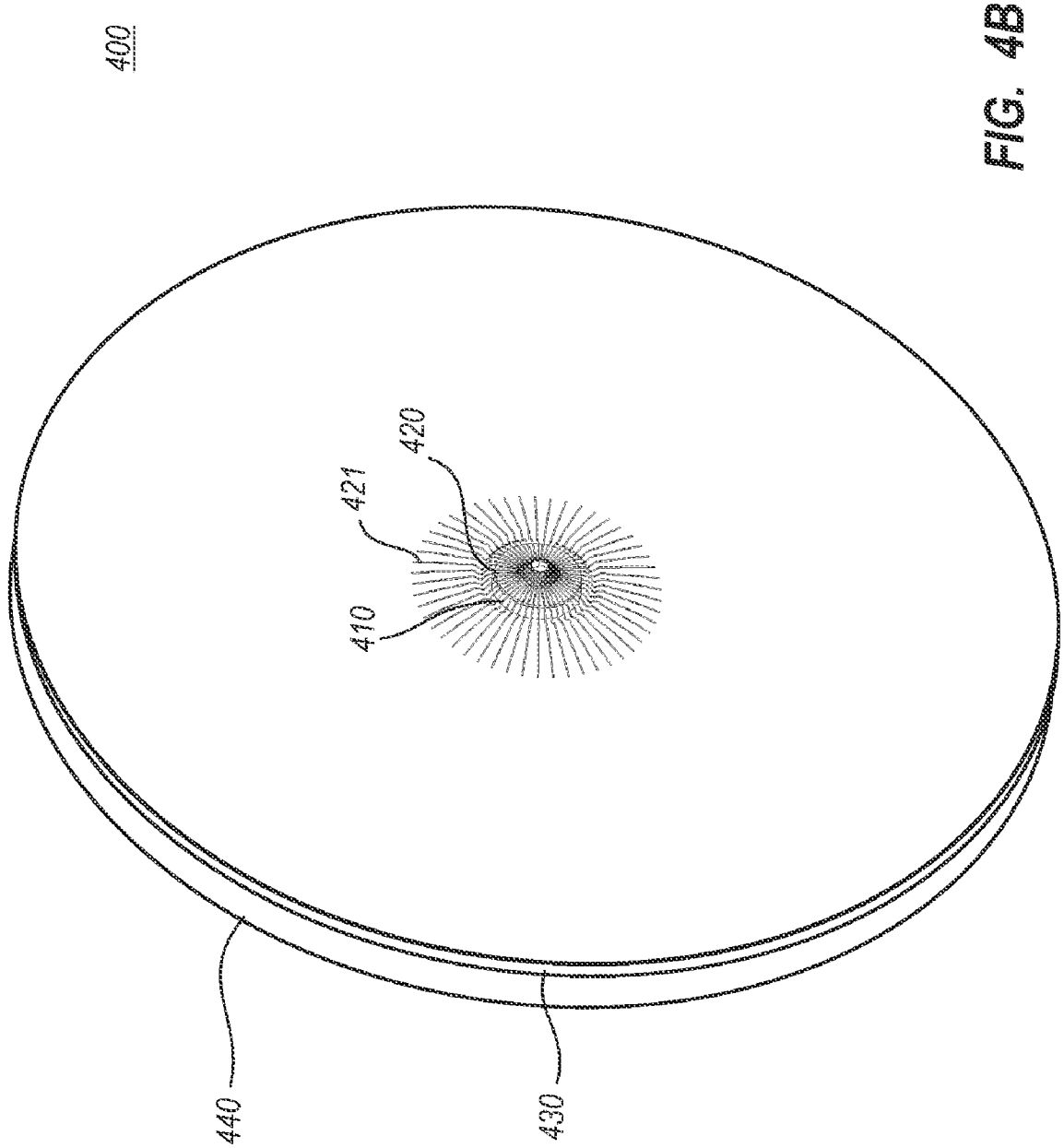

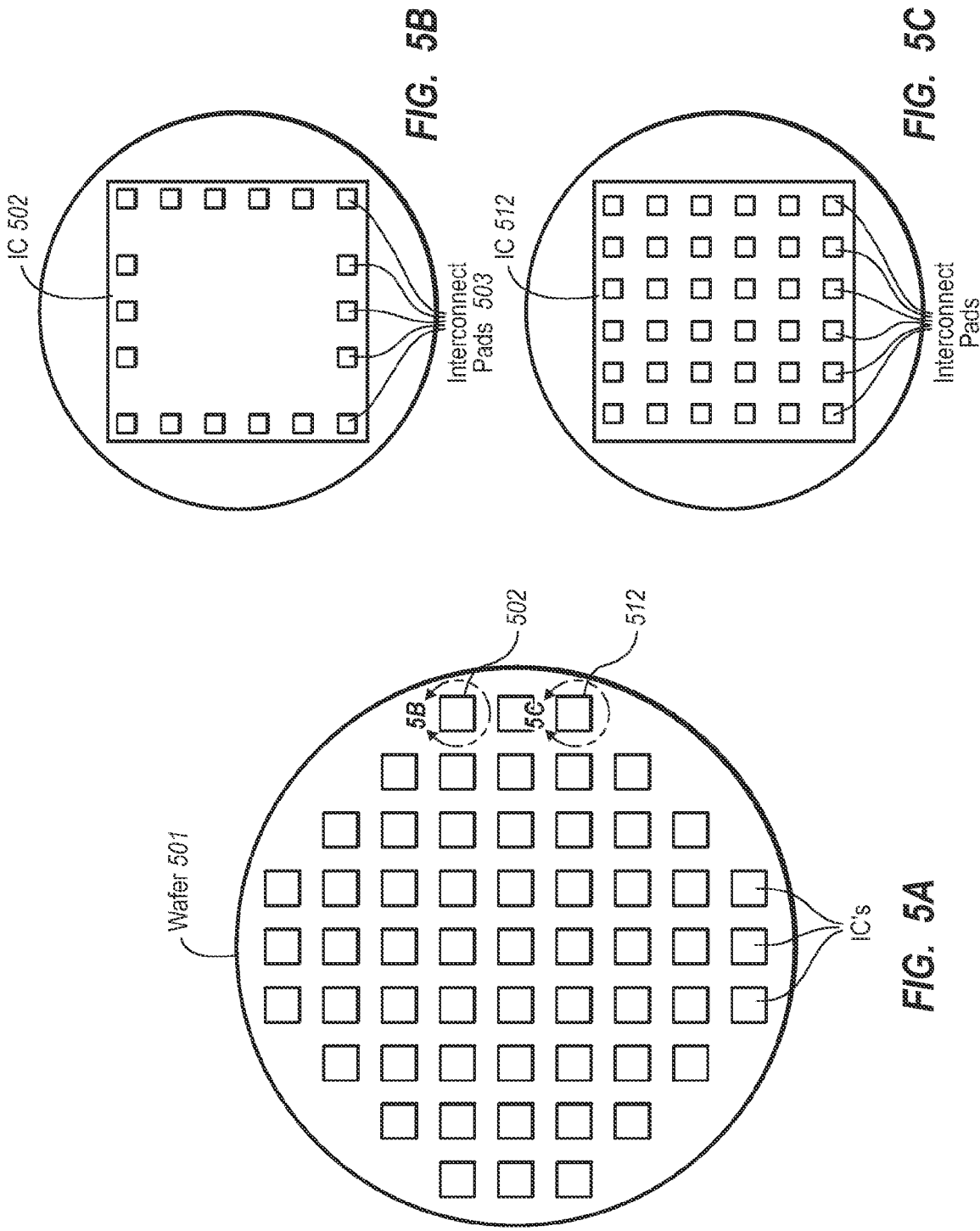

HIGH TEMPERATURE RANGE ELECTRICAL CIRCUIT TESTING

BACKGROUND OF THE INVENTION

Semiconductor integrated circuits are often formed by subjecting a semiconductor substrate to a series of processing steps by which an array of integrated circuits are formed on the substrate. The substrate is commonly, for example, a wafer formed of a crystalline semiconductor material. A common choice for the semiconductor material is silicon. The wafer is ultimately separated by dicing the wafer into various sections (each section being commonly referred to as a "die") in a manner that each die includes a corresponding integrated circuit. Each die is then packaged.

Once the integrated circuits are formed on the wafer, and prior to dicing the wafer, each integrated circuit on the wafer may be tested to verify proper operation. Typically, such testing might be attempted under the anticipated environmental operating extremes under which the integrated circuit is expected to operate. For examples, circuits may be anticipated to operate under different temperature, pressure, voltage, acceleration, noise or under other environmental conditions.

During testing of a particular wafer, the wafer is transported to a wafer test machine, wherein the various integrated circuits of the wafer may be tested. To test each integrated circuit, the wafer test probe head includes various probes that make mechanical and electrical contact with the various contacts of the integrated circuit under test. The integrated circuit is then tested by having the probe head apply test signals and power supplies to the integrated circuit through the probes, and by measuring appropriate response signals received back from the integrated circuit under test. Based on the response signals received, the wafer test machine may verify whether or not the integrated circuit is operating properly. The testing machine may then record which integrated circuits on the wafer passed the electrical test, and which failed the electrical test. The test results may be used later in the process when the wafer is diced into its various die. If the particular wafer is to be tested under anticipated environmental operating extremes, the probe head is also typically subjected to the same testing conditions. Likewise, any support circuitry contained on the test board which interfaces with the circuit under test is also typically subjected to the same testing conditions.

BRIEF SUMMARY

Embodiments described herein relate to an electrical circuit testing assembly that includes a mechanical reference that is relatively stationary as compared to a circuit under test at least during the testing process. A probe support assembly is coupled to the mechanical reference and includes probes for contacting interconnect pads on the circuit under test.

In one embodiment, the probe support structure is attached to the mechanical reference via a column that is highly thermally insulating. Accordingly, thermal variations are less likely to cause significant movement of the probes, and the probes are more likely to remain in contact with their corresponding interconnect pads over a wide range of temperatures. The probes may be electrically connected to testing circuitry on an associated testing circuitry support structure (such as a printed circuit board).

In one embodiment, the testing circuitry support structure is not rigidly attached to the mechanical reference or to the probe support structure, thereby permitting the testing circuitry support structure to float with respect to the probe support structure. Accordingly, as temperatures change, and as the testing circuitry support structure expands, contracts, and flexes, the testing circuit support structure floats its mechanical position, rather than excessively pressing on the probe support structure.

Additional embodiments will be set forth in the description that follows, and in part will be obvious from the description, or may be learned by the practice of the invention. The embodiments of the invention may be realized and obtained by means of the instruments and combinations particularly pointed out in the appended claims. These and other embodiments of the present invention will become more fully apparent from the following description and appended claims, or may be learned by the practice of the invention as set forth hereinafter.

BRIEF DESCRIPTION OF THE SEVERAL VIEWS OF THE DRAWINGS

In order to describe the manner in which the above-recited and other advantages and features of the invention can be obtained, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which:

FIG. 3D illustrates a top perspective exploded view of a probe head in accordance with the specific embodiment of FIG. 3A;

FIG. 4B illustrates a bottom perspective view of a probe head in accordance with the specific embodiment of FIG. 4A;

FIG. 5A illustrates a wafer having multiple integrated circuits formed thereon;

FIG. 5B illustrates in magnified view one of the integrated circuits of FIG. 5A showing that the integrated circuit contains multiple interconnect pads; and FIG. 5C illustrates in magnified view another of the integrated circuits of FIG. 5A showing that the interconnect pads may also be distributed over the area of the integrated circuit, rather than just around the periphery.

DETAILED DESCRIPTION OF THE PREFERRED EMBODIMENTS

Embodiments of the present invention relate to an electrical circuit testing assembly and/or its use. First, a wafer testing station will be abstracted illustrated and described with respect to FIGS. 1 and 5A through 5C. Next, a difficulty with performing integrated circuit testing over high temperature ranges will be outlined. Subsequently, a general testing head consistent with the embodiments of the present invention will be described with respect to FIG. 2. Finally, two very specific, but non-limiting, embodiments of the present invention will be described with respect to FIGS. 3A through 3D and 4A through 4D.

Figure 1:
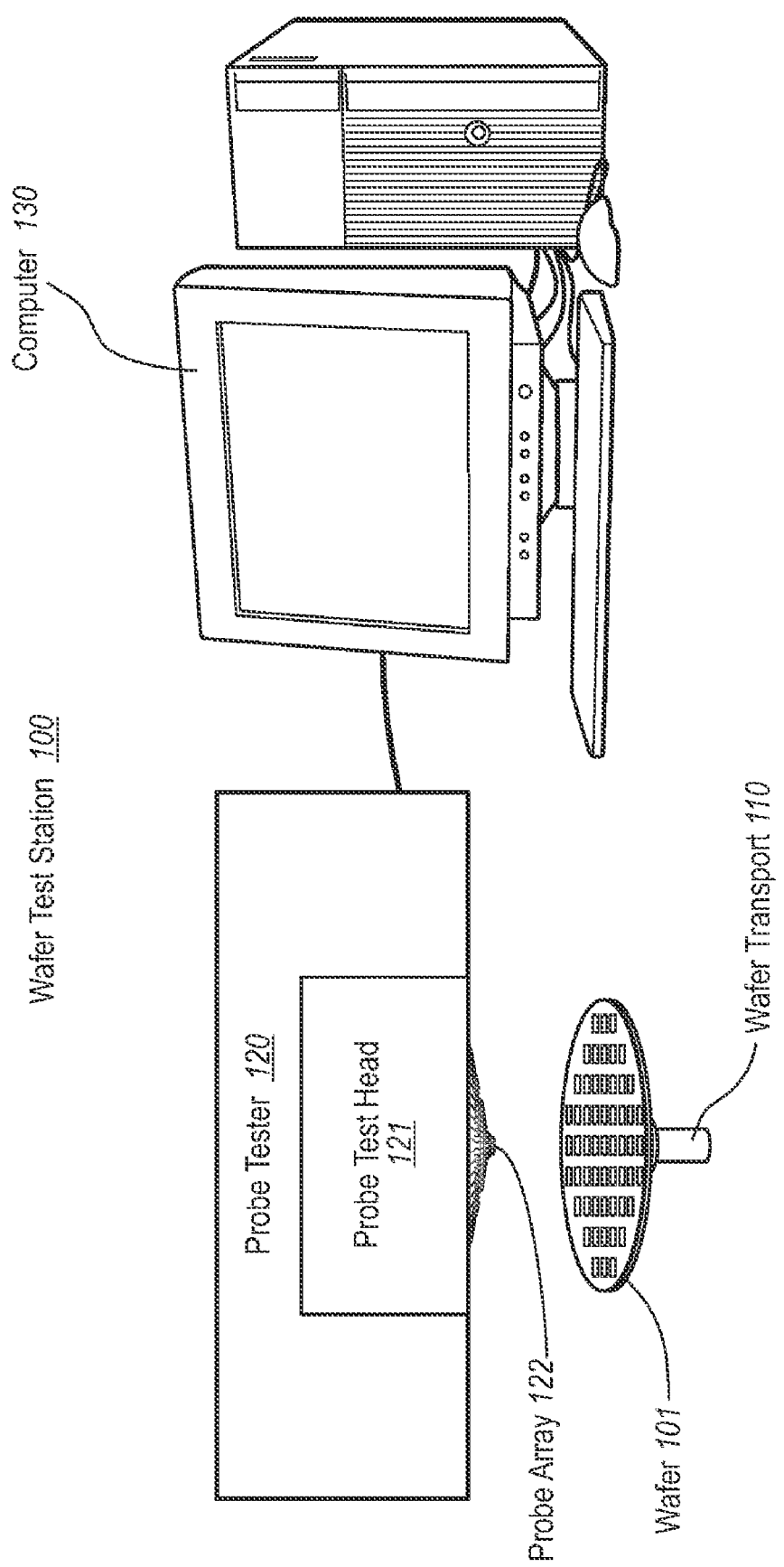
FIG. 1 abstractly illustrates a wafer testing station in which embodiments of the present invention may operate.

FIG. 1 illustrates a wafer test station 100 in which embodiments of the present invention may operate. The wafer test station 100 is abstractly illustrated to include a wafer 101, a wafer transport mechanism 110, a probe tester 120, and computer 130. The probe tester 120 further includes a probe test head 121 that includes an array of probes 122. The principles of the present invention are not limited to any particular wafer test station configuration, and thus such general features of a wafer test station are illustrated only abstractly in FIG. 1.

The wafer transport mechanism 110 brings the wafer 101 into the proximity of the probe tester 120. The wafer 101 may contain an entire array of integrated circuits to be tested. For instance, FIG. 5A illustrates a top view of a wafer 501 that includes an entire array of integrated circuits. Each integrated circuit includes an array of interconnect pads. For instance, FIG. 5B illustrates a magnified view of one of the integrated circuits 502. Integrated circuit 502 is illustrated as including interconnect pads 503 positioned, in this case, around the periphery of the integrated circuit 502. The principles of the present invention are not, however, limited to any particular configuration of such interconnect pads. For example, interconnect pads may often be found in areas of the integrated circuit other than the circuit's periphery. FIG. 5C illustrates an example of such an integrated circuit 512 in which the interconnect pads are distributed throughout the area of the integrated circuit. Such as circuit poses additional challenges in high temperature probing.

Referring back to FIG. 1, for each integrated circuit to be tested, the array of probes 122 are brought into mechanical and electrical contact with a corresponding array of interconnect pads on the integrated circuit. More typically, the wafer is moved to the probe test head 121, with the probe test head 121 being stationary. Alternatively or in addition, however, the principles of the present invention may also be applied to a configuration in which the probe test head 121 is not stationary, but is moved in order to be properly positioned with respect to the wafer.

In any case, bringing the array of probes 122 into contact with a corresponding array of interconnect pads on an integrated circuit requires refined alignment of the wafer 101 to the probe test head 121. This alignment might be accomplished by any automated and/or user-assisted alignment techniques such as those now known in the art, or any yet to be developed.

Interconnect pads are typically very small, being often measured in dimensions of mere microns (one micron=$\frac{1}{1000}^{th}$ of a millimeter). Presently, interconnect pads are often less than even 50 microns in feature dimension size, although some are smaller, and interconnect pad sizes may become even smaller as technology advances. Interconnect pads often take the form of a thin layer of conductive material that is square or rectangular in layout as illustrated by the interconnect pads 503 of FIG. 5B. However, in this description and in the claims, an "interconnect pad" is any conductive structure of the integrated circuit that is mechanically and electrically accessible at the time of testing, regardless of the geometric shape of the pad. Such pads would typically be electrically coupled to circuitry within the integrated circuit under test, and provide a mechanism for inputting electrical signals into the integrated circuit under test, and/or receiving electrical signals from the integrated circuit under test.

Referring back to FIG. 1, although not required, a computer 130 is often coupled to the probe tester 120. The computer 130 may be used to perform visual inspection of the wafer, to manage the testing processes, to control the signals to be applied to the wafer during testing, to interpret and evaluate signals being received back from the wafer, and/or to track and report regarding the integrated circuit die that pass or fail tests. Alternatively or in addition, such functionality may be accomplished in full, or in part, by the probe tester 120 itself. If a computer is used, there is no requirement that the computer have a similar appearance to the computer 130 shown in FIG. 1. Thus, in this description and in the claims, a "computer" is any device or system (whether distributed or not) that is capable of processing information.

Having described abstractly the general components of a wafer test station 100 with respect to FIG. 1, problems associated with testing wafers over large temperature ranges will now be described.

As previously mentioned, when performing testing of an integrated circuit on a wafer, a probe is placed mechanically and electrically in contact with a corresponding interconnect pad. Each probe may often be constructed as a cantilever, with a tip protruding from end of the cantilever for making contact with the corresponding interconnect pad. The other end of the cantilever is coupled to an epoxy ring. The other probes are similarly formed such that the probes extend inward towards the center of an epoxy ring that supports the probes.

The interconnect pads are quite small, being typically less than 50 microns square. Tungsten needle probes can have a tip diameter of nominally 25 microns or less. Although the principles of the present invention are not limited to these particular dimensions, the use of this example does illustrate some of the issues with performing testing at high temperatures. If the interconnect pad were 50 microns square, for example and the probe tip diameter were 25 microns, to maintain mechanical and electrical contact, the tip position of the probe might need to be maintained within 5 microns or less of tolerance (one micron=$\frac{1}{1000}$ millimeter) in the X and Y axis (defining the plane of the interconnect pad) and in the Z-axis (perpendicular to the interconnect pad). Also, the number of probes on the probe card assembly may range from less than 10 to more than 1000.

All of these probes must maintain mechanical and electrical contact with any corresponding interconnect pad that influences the functionality of the circuit in order to ensure proper testing results. In current testing practice, it is assumed that all of the interconnect pads influence the functionality of the circuit. Thus, under such current testing practice, the probes are to maintain mechanical and electrical contact with all interconnect pads. Otherwise, there is a risk of improper or inaccurate test results.

Furthermore, with dimensions of interconnect pads and probe tip diameter decreasing, and with the number of pads potentially increasing, the problem of precise probe placement become even more difficult to address under high temperature ranges. Accordingly, there is a certain refined level of probe placement that is needed in order to maintain mechanical and electrical contact between the probe and interconnect pad.

Since the integrated circuit is often intended to operate under a wide range of temperatures, the integrated circuit is likewise tested under a wide range of temperature conditions. Accordingly, the contact between the probe and interconnect pad is to be maintained during the testing procedure even under a range of temperatures. Otherwise, if temperature changes cause the probe to move out of electrical contact with the interconnect pad due to, for example, thermal expansion, contraction, or strain, the testing process could result in a false test fail, which may possibly result in the discarding of a perfectly good integrated circuit die, or in some cases, the acceptance of a faulty integrated circuit die.

The thermal stability of the probe placement and movement is thus important. Movement of the probes to the edges of the pad area in the X-Y plane may damage the protective passivation on the wafer and result in false electrical test failures and device reliability problems. Movement in the Z direction may result in increased probe pressure, which can result in damage to the pad or the underlying structures. Accordingly, movement of the tip with respect to the pad could result in structural harm to the circuit or cause problems in subsequent production flow of the die such as package assembly.

The current history and market trend is to attach the cantilever tungsten probe ring assembly directly to a printed circuit board that contains the electrical circuitry that performs the tests. Conventional techniques have addressed the thermal stability issues in part by supporting the printed circuit board that contains the testing circuitry with mechanical stiffeners or by using internal metal layers to increase thermal stability. Other mechanisms involve pulling heat away from the printed circuit board. Despite the abundant presence for quite some time of integrated circuits that operate under very high temperature ranges, the thermal stability of probe placement remains a problem when operating under high temperature ranges.

Figure 2:
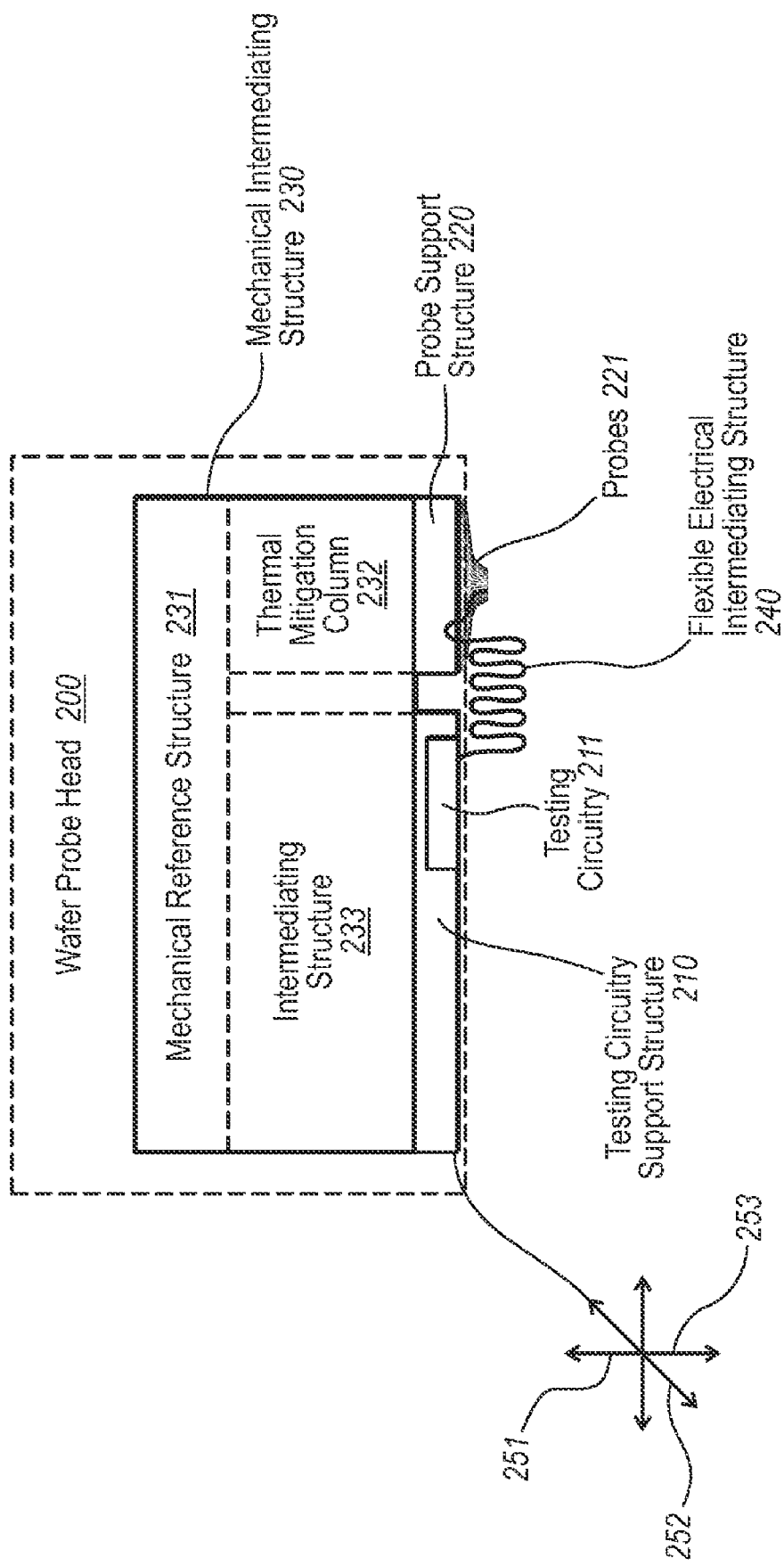
FIG. 2 abstractly illustrates a wafer testing head operating upon a wafer in accordance with embodiments of the present invention.

FIG. 2 abstractly illustrates components of a wafer probe head 200 that may be or that may form a component of an electrical circuitry testing assembly. The wafer probe head 200 includes a testing circuitry support structure 210 that includes testing circuitry 211, a probe support structure 220 that includes one or more probes 221, a mechanical intermediating structure 230, and a flexible electrical intermediating structure 240. Once again, FIG. 2 is simply an abstract representation to illustrate symbolically various components of the wafer probe head 200. Since there are so many and enumerable varieties of ways in which these components may be configured, FIG. 2 illustrates the components and relations in only an abstract sense. Specific examples will be provided further below with respect to a first example in FIGS. 3A through 3D, and with respect to a second example in FIGS. 4A through 4D.

The testing circuit support structure 210 may be, for example, a printed circuit board, although that is not required. The testing circuitry 211 may be quite complex and perform complicated testing algorithms and include memory, or the testing circuitry 211 might be quite simple and merely communicate signals, or derivatives thereof, to and from other circuitry not shown in FIG. 2.

The probe support structure 220 supports probes 221 and may be any structure that can support one or more probes. In one embodiment, the probe support structure may be an epoxy ring that supports a circular arrangement of cantilever probes as are known in the art. However, the probe support structure is not limited to any particular structure or numbers of probes. The principles of the present invention are also not limited to the use of cantilever probes. The probe support structure 220 is shown next to the testing circuitry support structure 210. The representation of the probe support structure 220 and the testing circuitry support structure 210 are, along with other components of FIG. 2, only abstract in FIG. 2, and thus should not imply any actual limitation as to position, size, connectivity. or structure associated with the illustrated components of FIG. 2.

The mechanical intermediating structure 230 is structured to permit the testing circuitry support structure 210 to move, at least within a certain range with respect to the probe support structure 220. Such freedom of movement is represented symbolically using arrows 251 through 253, although freedom of movement in all directions is not necessary. Accordingly, the testing circuitry support structure 210 may expand, contract, and flex when experiencing thermal gradients, without imposing as much force on the probe support structure 220 such that the connectivity to the probe pad is lost. In some embodiments, the mechanical intermediating structure 230 is non-rigidly coupled to the testing circuitry support structure 210 to permit such movement. In some embodiments, the testing circuitry support structure 210 may be free to move as its structure changes due to thermal changes, without directly contacting at all the probe support structure 220, although that is not required. In this description and in the claims, "non-rigidly coupled" means that one object may move with respect to another with the application of testing temperature ranges.

The flexible electrical intermediating structure 240 permits electrical communication between the probe support structure 220 and the testing circuitry support structure 210 even though the probe support structure 220 is free to move relative to the testing circuitry support structure 210, at least within a certain range. In one embodiment, the flexible electrical intermediating structure 240 includes a wire bent as a two-dimensional spring in a general jagged or zigzag form. However, the shape of the electrical intermediating structure 240 may be of any shape that permits movement in the testing circuitry support structure 210 without influencing the position of the probe support structure 220 and probes 221, thereby permitting the wire to stretch and contract while maintaining electrical contact between the corresponding probe and the testing circuit support structure 210.

In one embodiment, the mechanical intermediating structure 230 includes a mechanical reference 231 which is positioned to be relatively still with respect to the wafer when the wafer is being tested. In one embodiment, the mechanical reference 231 may be relatively stationary within the wafer probe tester 110 (see FIG. 1) while the wafer is kept relatively stationary during testing.

The mechanical intermediating structure 230 may also include a thermal mitigation column 232, although not required. The thermal mitigation column 232 provides high levels of thermal isolation between the mechanical reference 231 and the probe support structure 220 that might otherwise occur via thermal coupling from the heated die through the probes 221 and the probe support structure 220. Accordingly, when temperature changes are applied to the probe support structure 220, the probe support structure 220 may remain more still with respect to both the mechanical reference 231 and the wafer itself, even in the presence of large temperature ranges.

In one embodiment, testing may be accomplished over wide temperature ranges such as 200 degrees Celsius, 300 degrees Celsius, and even much higher. The thermal mitigation column 232 may be any shape, need not be cylindrical, and need not even have a spatially constant cross-section. However, specific examples of a thermal mitigation column will be provided with respect to FIGS. 3A through 3D, and FIGS. 4A through 4D. In one embodiment, and although not required, the thermal mitigation column may be fabricated of quartz, ceramic, or another material of low thermal conductivity. Although such a low thermal conductivity column provides some advantages, the column need not have low thermal conductivity to maintain consistency with the principles of the present invention. Still more, for some embodiments, keep in mind that the thermal mitigation column 232 is not even a required feature at all.

The thermal mitigation column is structured to provide sufficient thermal isolation between the mechanical reference and the probe support mechanism such that if 1) the mechanical reference is fixed with respect to an interconnect pad of size 50 microns or less of a circuit under test, and 2) the probe is in mechanical contact with the interconnect pad, and 3) the temperature is permitted to vary a range of at least 200 degrees, then the probe maintains mechanical and electrical contact with the interconnect pad. Higher levels of thermal isolation in the mitigation column will permit yet larger test temperature ranges.

Although not required, the mechanical intermediating structure 230 may also include a testing circuitry support structure intermediating structure 233 that is rigidly attached to the mechanical reference 231, but is configured to non-rigidly receive the testing circuit support structure 210.

FIGS. 3A through 3D illustrate various views of a probe head 300 in accordance with a first specific embodiment of the present invention. Note that the specific embodiments of FIGS. 3A through 3D and FIGS. 4A through 4D are simply two of an enumerable variety of probe head embodiments that may be implemented. To illustrate all the possible embodiments would be infeasible, and would unduly complicate this description, potential obfuscating the broader principles of the present invention. Accordingly, the embodiments described with respect to FIGS. 3A through 3D and FIGS. 4A through 4D should be viewed as illustrative only, and not limiting of the invention, even for characteristics that are common between the two embodiments. Rather, the features of the invention should be construed with reference to the claims.

Figure 3A:
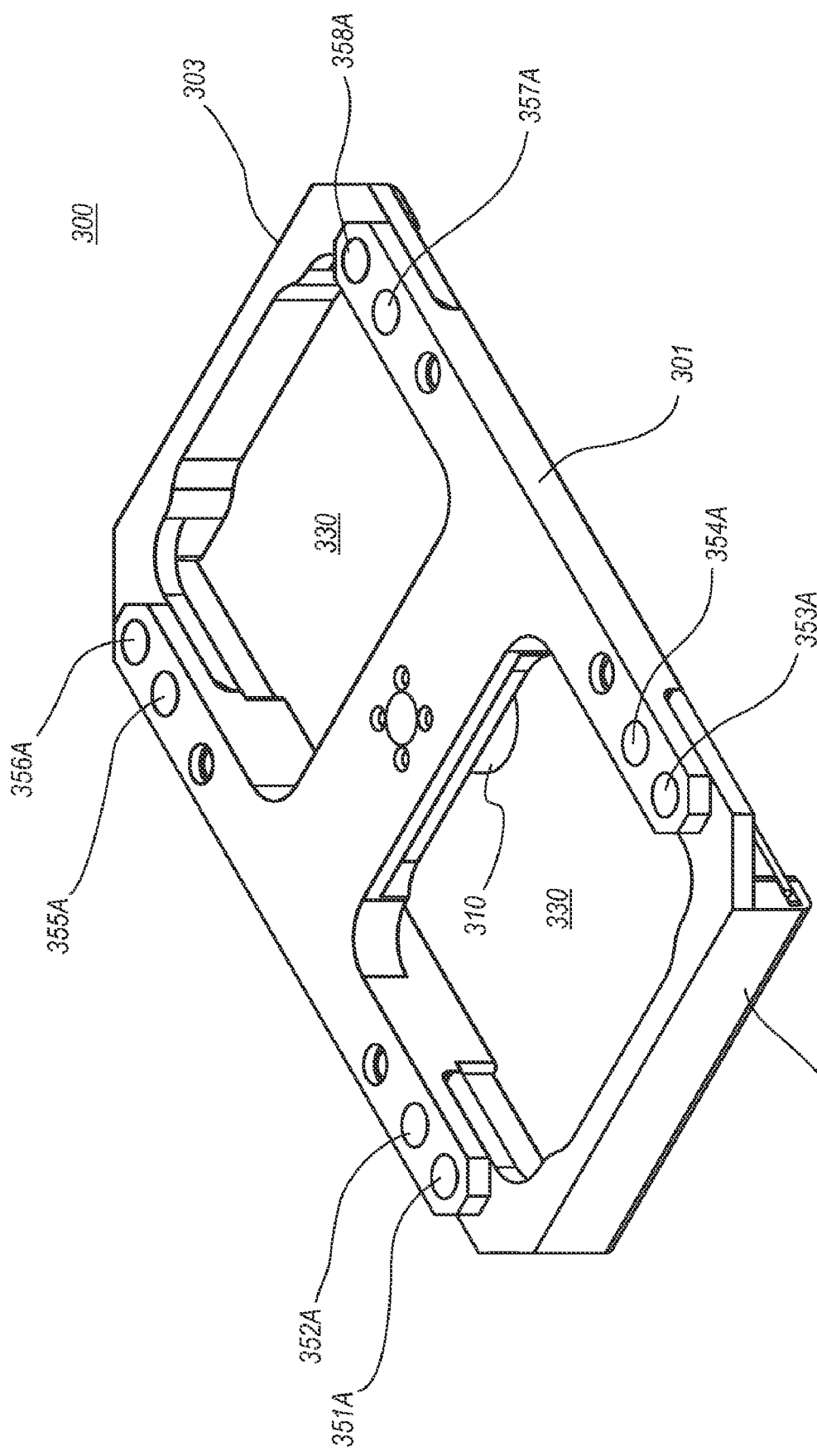
FIG. 3A illustrates a top perspective view of a probe head in accordance with a first specific embodiment of the present invention.
Figure 3B:
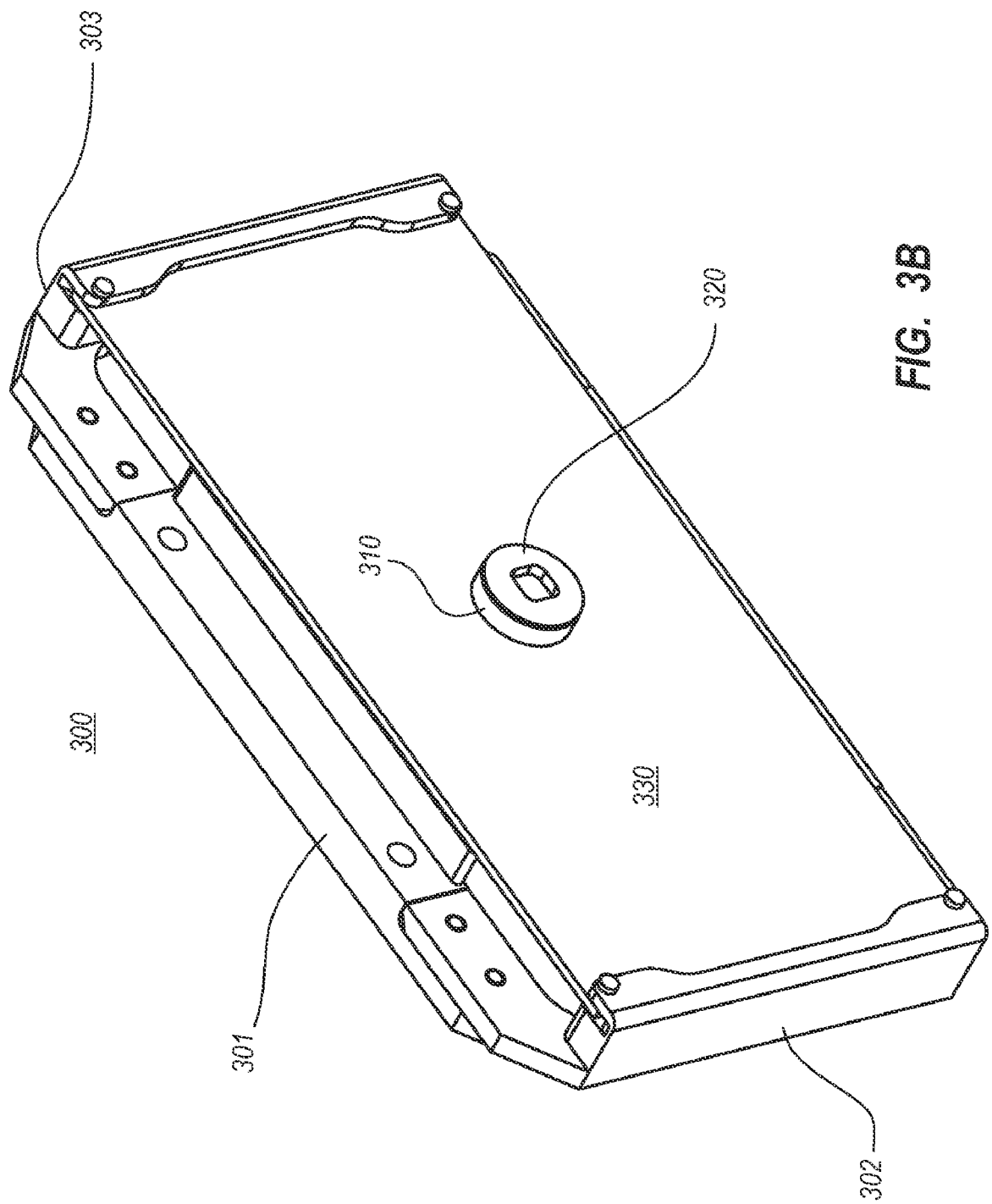
FIG. 3B illustrates a bottom perspective view of a probe head in accordance with the specific embodiment of FIG. 3A.
Figure 3C:
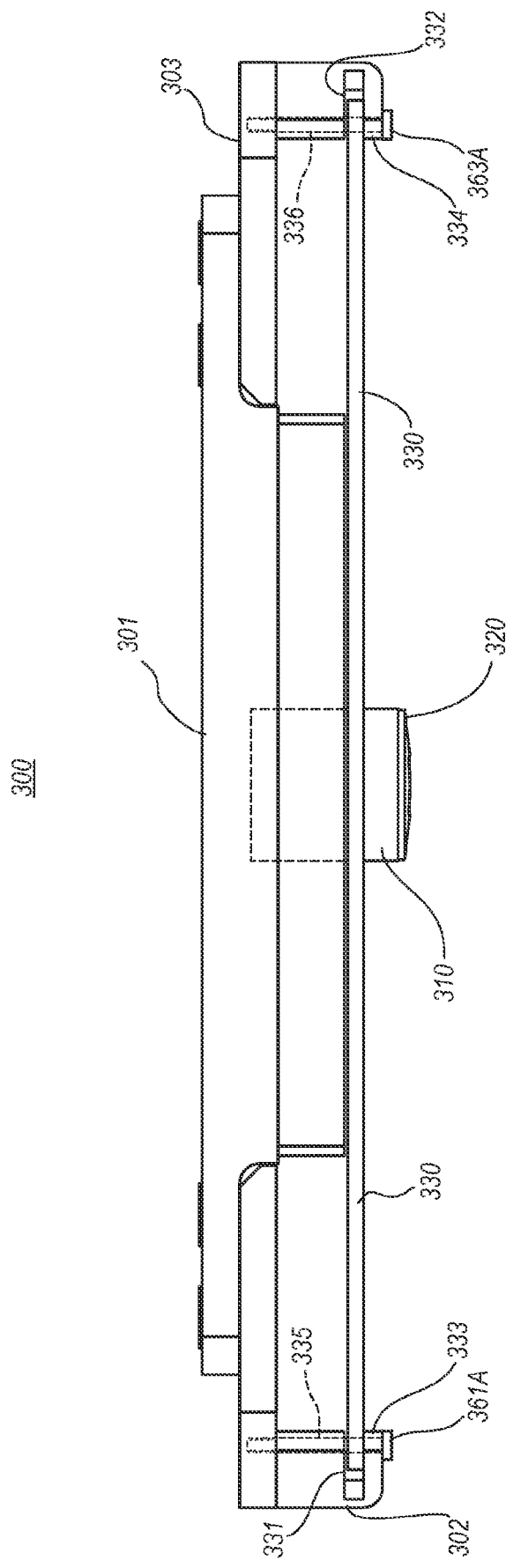
FIG. 3C illustrates a side view of a probe head in accordance with the specific embodiment of FIG. 3A.

FIGS. 3A, 3B and 3C illustrate top perspective, bottom perspective, and side views, respectively, of the probe head 300 in accordance with the first specific embodiment of the present invention. So that specific elements can be more easily viewed, FIG. 3D illustrates a top perspective exploded view of a probe head 300 in accordance with the specific embodiment of FIG. 3A through 3C. Some elements may be hidden in some views, and thus the first specific embodiment will be described with respect to the collection of FIGS. 3A through 3D.

The probe head 300 includes a cable card holder center 301, two cable card holder shoulders 302 and 303, a post 310, a ceramic probe ring 320, and a cable card 330. The cable card holder shoulder 302 may attach to the cable card holder center 301 by applying screws 351A through 354A through respective screw holes 351B through 354B of the cable card holder center 301 and into the respective screw holes 351C through 354C of the cable card holder shoulder 302. Likewise, cable card holder shoulder 303 may attach to the cable card holder center 301 by applying screws 355A through 358A through respective screw holes 355B through 358B of the cable card holder center 301 and into the respective screw holes 355C through 358C of the cable card holder shoulder 303.

The cable card 330 may be, for example, a printed circuit board with a connector (not shown) for attaching a data cable for communication with an external computer. The cable card 330 is slid into the receiving edge 331 of the cable card holder shoulder 302 and into the receiving edge 332 of the cable card holder shoulder 303. Referring to FIGS. 3C and 3D specifically, to non-rigidly secure the cable card 330, two screws 361A and 362A are passed through a portion 333 of the cable card shoulder 302, through a respective oversized holes 361B and 362B of the cable card 330, and into a portion 335 of the cable card shoulder 302. Similarly, two screws 363A and 364A are passed through a portion 334 of the cable card shoulder 304, through a respective oversized holes 363B and 364B of the cable card 330, and into a portion 336 of the cable card shoulder 303. In this way, even after the screws 351A through 354D are tightened, the cable card 330 is still permitted free movement with respect to the cable card holder.

In this example, the cable card holder center 301, and the cable card holder shoulders 302 and 303 will be single rigid piece that is an example of the mechanical reference 231 that stays relatively still with respect to the circuit under test. The post 310 of FIGS. 3A through 3D is an example of the thermal mitigation column 232 of FIG. 2. The post may be composed of, for example, ceramic. The post 310 is shown as being hollowed out. Such hollowing is not necessarily for providing thermal mitigation, but may be used to allow an operator to visually see the underlying probe ring and probes through the post. A solid post will also suffice.

The cable card holder shoulders 302 and 303 of FIGS. 3A through 3D represent an example of the mechanical intermediating structure 233 of FIG. 2. The printed circuit board 330 of FIGS. 3A through 3D is an example of the testing circuitry support structure 210 of FIG. 2. The probe ring 320 of FIGS. 3A through 3D is an example of the probe support structure 220 of FIG. 2. The use of the probe ring 320 allows the probes to be conveniently pre-mounted to the probe ring 320 prior to the probe ring 320 being attached to the post 310. However, in one embodiment, the probe ring 320 may be absent, in which case, the probes may perhaps be mounted directly to the post 310

In FIGS. 3A through 3D, the thermal mitigation column (e.g., post 310 in this example) passes through a hole 333 in the testing circuitry support structure 330 such that the mechanical reference (e.g., the cable card holder 301, 302 and 303) is on one side of the testing circuitry support structure while the probe support structure (e.g., the probe ring 320) is on the other side of the testing circuitry support structure.

Although not necessarily distinguishable from FIGS. 3A through 3D due to the dimensions involved, the hole 333 in the testing circuit support structure (e.g., the printed circuit board 330) may be larger than the cross section at the testing circuit support structure of the thermal mitigation column (e.g., the hollow ceramic post 320) that passes through the testing circuit support structure. Furthermore, the testing circuitry support structure is not rigidly attached to the thermal mitigation column.

In addition, a non-rigid securing mechanism is configured to secure the testing circuitry support structure (e.g., the printed circuit board 330) within the testing circuitry support structure intermediating structure (e.g., at the receiving ridges 331 and 332 of the respective cable card holder shoulders 302 and 303) while permitting the testing circuitry support structure to move within a certain range with respect to the testing circuitry support structure.

Figure 4A:
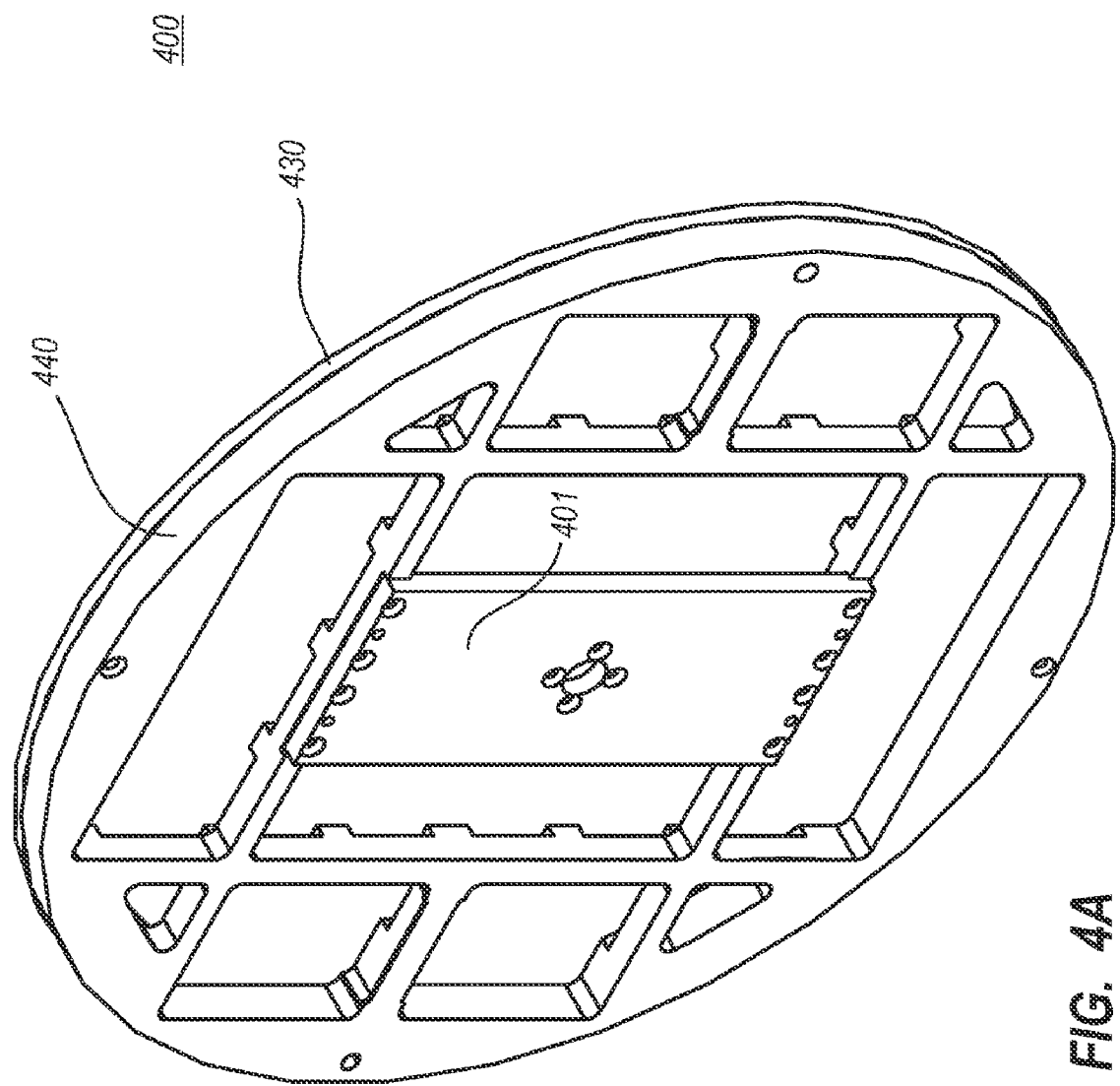
FIG. 4A illustrates a top perspective view of a probe head in accordance with a second specific embodiment of the present invention.
Figure 4C:
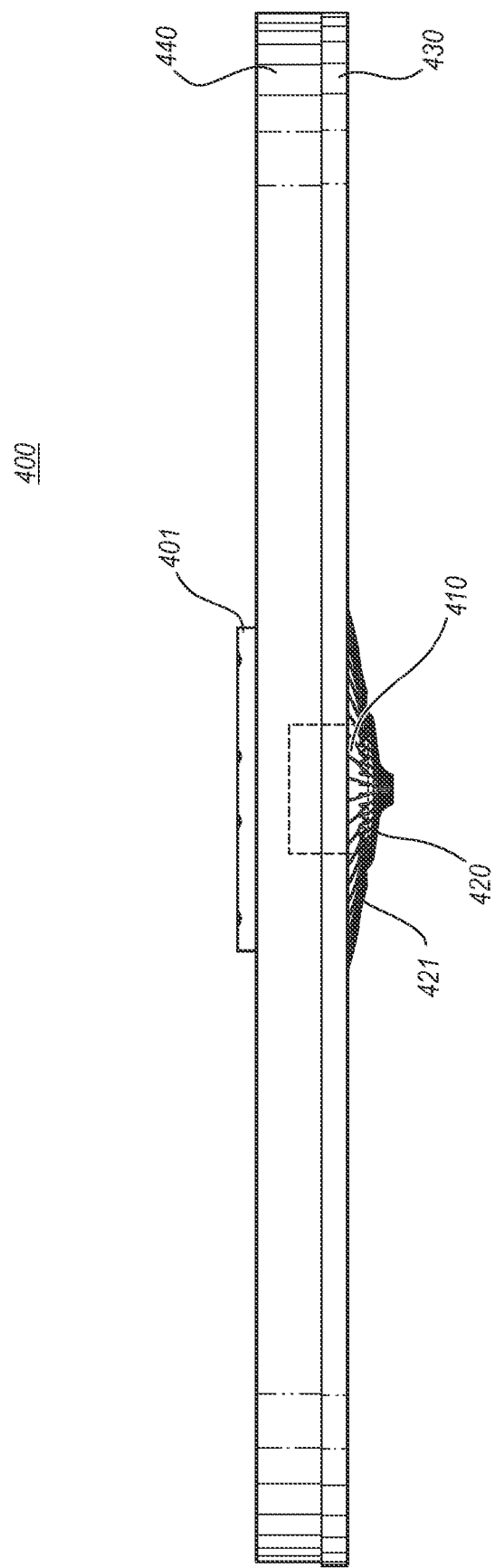
FIG. 4C illustrates a side view of a probe head in accordance with the specific embodiment of FIG. 4A.
Figure 4D:
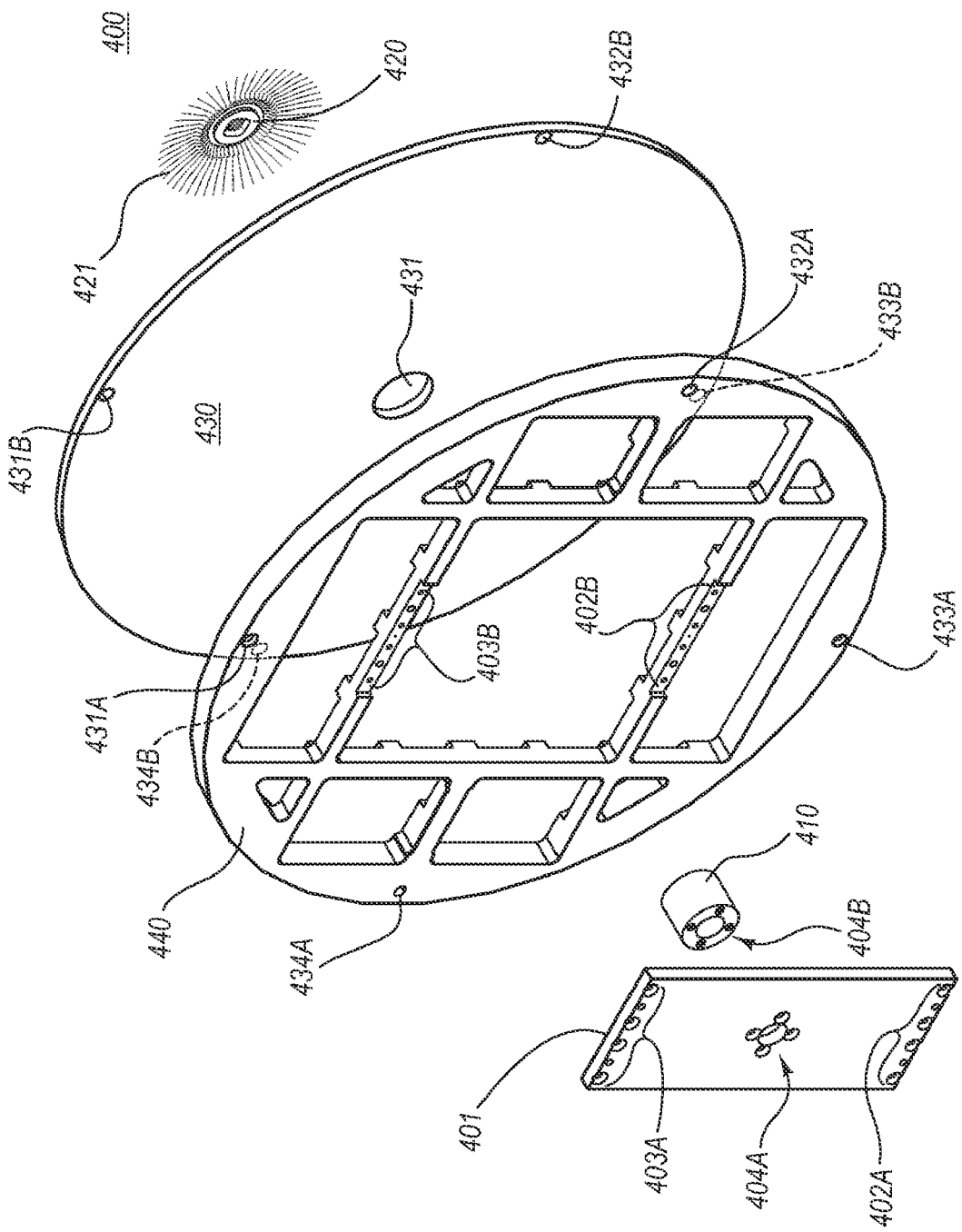
FIG. 4D illustrates a top perspective exploded view of a probe head in accordance with the specific embodiment of FIG. 4A.

FIGS. 4A through 4D illustrate various views of a probe head in accordance with a second specific embodiment of the present invention. FIGS. 4A, 4B and 4C illustrate top perspective, bottom perspective, and side views, respectively, of the probe head 400 in accordance with the second specific embodiment of the present invention. So that specific elements can be more easily viewed, FIG. 4D illustrates a top perspective exploded view of a probe head 400 in accordance with the specific embodiment of FIG. 4A through 4C. Once again, some elements may be hidden in some views, and thus the first specific embodiment will be described with respect to the collection of FIGS. 4A through 4D.

In this case, a mechanical reference may be the bridge 401. The bridge 401 may be rigidly fastened to a stiffener structure 440. For instance, screws may be used to fasten the bridge 401 to the stiffener structure 440 using screw holes 403A (see FIG. 4D) in the bridge 401 and screw receivers 403B in the stiffener structure 440. Likewise, screws may be used using the screw holes 402A in the bridge 401 and the screw receivers 402B in the stiffener structure 440.

Likewise, screws may be used to attach a circular printed circuit board 430 to the stiffener 440 through screw holes 431A through 434A and through corresponding oversized screw holes 431B through 434B. The printed circuit board 430 represents one example of the testing circuitry support structure 210 of FIG. 2, and may include testing circuitry (not shown). Since the screw holes 431B through 434B are larger than needed, and since the screws are not tightly compressing the printed circuit board 430, the printed circuit board 430 is not rigidly secured to the stiffener 440. Instead, the printed circuit board 430 is permitted to move relative to the stiffener 440. Accordingly, in this configuration, the stiffener 440 of FIGS. 4A through 4B may be considered as an example of the testing circuitry support intermediating structure 233 of FIG. 2.

A post 410 (which once again may be hollow or solid) is rigidly attached to the bridge 401 using screw holes 404A in the bridge 401 and corresponding screw holes 404B in the post 410 (see FIG. 4D). In one embodiment, the post 410 is ceramic. The post 410 of FIGS. 4A through 4D represents an example of the thermal mitigation column 232 of FIG. 2.

The post 410 extends through a hole 431 in the circular printed circuit board 430. The hole 431 may be somewhat oversized to allow for the printed circuit board 430 to experience thermal expansion, contraction, and flexing, while applying little or no force on the post 410.

The probe ring 420 is attached to the post 410 on the other end of the printed circuit board 430. The probe ring 420 represents one embodiment of the probe support structure 220 of FIG. 2. The probe ring may have thereon, a ring of inwardly facing cantilever probes (not shown in FIGS. 4A through 4D).

The probes are electrically connected to the printed circuit board 430 using electrical connections 421. These electrical connections include some capability to flex since the printed circuit board 430 may move relative to the probe ring 420. In one embodiment, the electrical connections are wires having some bending in them, to allow for the wires to be stretched without straining the wires. The electrical connections 421 of FIGS. 4A through 4D are examples of the flexible electrical intermediating structure 240 of FIG. 2. Once again, however, the electrical connections may take any form that permits movement of the printed circuit board 430 with respect to the probe ring 420.

Accordingly, a test probe technology has been described that permits the testing circuitry support structure to move, at least within a limited range and at least in one direction, with respect to the probe support structure. This permits high temperature probe testing since the testing circuitry support structure is less likely to apply significant pressure on the probe support structure, thereby allowing the probes to retain proper positioning over large temperature ranges without being significantly influenced by movement in the testing circuitry support structure. Alternatively or in addition, the thermal mitigation column permits the probe support structure to stay relatively stationary with respect to the mechanical reference.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes, which come within the meaning and range of equivalency of the claims, are to be embraced within their scope.

What is claimed and desired secured by United States Letters Patent is:

1. An electrical circuit testing assembly comprising:
   a testing circuitry support structure having testing circuitry;
   a probe support structure that includes at least one electrical probe;
   a mechanical intermediating structure that is structured to permit the testing circuitry support structure to move relative to the probe support structure; and
   a flexible electrical intermediating structure that permits electrical communication between the probe support structure and the testing circuitry support structure even though the probe support structure is free to move relative to the testing circuitry support structure, at least within a certain range, wherein the mechanical intermediating structure permits the testing circuit support structure to move relative to the probe support structure while supporting the testing circuitry support structure, and while maintaining electrical connection between the probe support structure and the testing circuitry support structure.

2. An electrical circuit testing assembly in accordance with claim 1, wherein the testing circuitry support structure includes a printed circuit board.

3. An electrical circuit testing assembly in accordance with claim 2, wherein the printed circuit board has a hole formed therein, the mechanism intermediating structure further comprising:
   a mechanical reference;
   a printed circuit board holding structure rigidly attached to the mechanical reference and but non-rigidly holding the printed circuit board support; and
   a thermal mitigation column coupling the mechanical reference to the probe support structure through the hole in the printed circuit board, wherein the thermal mitigation column is not rigidly attached to the printed circuit board.

4. An electrical circuit testing assembly in accordance with claim 3, wherein the probe support structure comprising a ring-shaped array of inwardly facing cantilever probes.

5. An electrical circuit testing assembly in accordance with claim 1, wherein the mechanical intermediating structure comprises:
   a mechanical reference; and
   a thermal mitigation column coupling the mechanical reference to the probe support structure.

6. An electrical circuit testing assembly in accordance with claim 5, wherein the thermal mitigation column provides high levels of thermal isolation between the mechanical reference and the probe support structure.

7. An electric circuit testing assembly in accordance with claim 6, wherein the thermal mitigation column is hollow.

8. An electrical circuit testing assembly in accordance with claim 6, wherein the thermal mitigation column is composed of ceramic or quartz.

9. An electrical testing assembly in accordance with claim 6, wherein the thermal mitigation column is composed of a low thermal conducting material.

10. An electrical circuit in accordance with claim 5, wherein the thermal mitigation column passes through a hole in the testing circuitry support structure such that the mechanical reference is on one side of the testing circuitry support structure while the probe support structure is on the other side of the testing circuitry support structure.

11. An electrical circuit in accordance with claim 10, wherein the hole in the testing circuit support structure is larger than the cross section at the testing circuit support structure of the thermal mitigation column that passes through the testing circuit support structure, and wherein the testing circuit support structure is not rigidly attached to the thermal mitigation column.

12. An electrical circuitry testing assembly in accordance with claim 5, wherein the mechanical intermediating structure further comprises:

a testing circuitry support structure intermediating structure rigidly attached to the mechanical reference and configured to non-rigidly receive a testing circuit support structure such that the at least one electrical probe may be electrically connected to testing circuitry within the testing circuitry support structure.

13. An electrical circuit testing assembly in accordance with claim 12, wherein the testing circuitry support structure intermediating structure further comprises:

a non-rigid securing mechanism configured to secure the testing circuitry support structure within the testing circuitry support structure intermediating structure while permitting the testing circuitry support structure to move within a certain range with respect to the testing circuitry support structure.

14. An electrical circuit testing assembly in accordance with claim 12, wherein the thermal mitigation column is structured to provide sufficient thermal isolation between the mechanical reference and the probe support mechanism such that if 1) the mechanical reference is fixed with respect to an interconnect pad of size 50 microns or less of a circuit under test, and 2) the probe is in mechanical contact with the interconnect pad, and 3) the temperature is permitted to vary and over a range of 200 degrees C., then the probe maintains mechanical and electrical contact with the interconnect pad.

15. An electrical circuit testing assembly in accordance with claim 14, wherein the testing circuitry support structure is received into the testing circuitry support structure intermediating structure.

16. An electrical circuit testing assembly in accordance with claim 12, wherein the thermal mitigation column is composed of quartz or materials that in combination have less than twice the thermal conductivity of quartz.

17. The electrical circuitry testing assembly in accordance with claim 1, wherein the mechanical intermediating structure is structured to be non-rigidly coupled to the testing circuitry support structure to allow movement of the testing circuitry support structure with respect to the mechanical intermediating structure, at least within a certain range of movement.

* * * * *

UNITED STATES PATENT AND TRADEMARK OFFICE
CERTIFICATE OF CORRECTION

PATENT NO.         : 7,816,930 B2
APPLICATION NO.    : 11/871716
DATED              : October 19, 2010
INVENTOR(S)        : Young et al.

It is certified that error appears in the above-identified patent and that said Letters Patent is hereby corrected as shown below:

Column 3
Line 6, change "abstracted" to --abstracted,--
Line 40, change "as" to --a--

Column 4
Line 31, change "from end" to --from the end--
Line 63, change "become" to --becomes--

Column 7
Line 34, change "potential" to --potentially--
Line 48, change "FIG." to --FIGS.--

Column 8
Line 6, remove [a]
Line 10, change "shoulder 304" to --shoulder 303--
Line 16, after "will be" insert --a--
Line 37, after "310" insert --.--
Line 50, change "ceramic post 320" to --ceramic post 310--

Column 9
Line 3, change "FIG." to --FIGS.--

Signed and Sealed this
Thirteenth Day of December, 2011

David J. Kappos
*Director of the United States Patent and Trademark Office*